United States Patent [19]

Behun et al.

[11] Patent Number: 5,565,119
[45] Date of Patent: Oct. 15, 1996

[54] METHOD AND APPARATUS FOR SOLDERING WITH A MULTIPLE TIP AND ASSOCIATED OPTICAL FIBER HEATING DEVICE

[75] Inventors: John R. Behun, Williston, Vt.; Pedro A. Chalco, Yorktown Heights, N.Y.; Joseph Funari; J. Robert Young, both of Vestal, N.Y.

[73] Assignee: International Business Machines Corporation, Armonk, N.Y.

[21] Appl. No.: 431,245

[22] Filed: Apr. 28, 1995

[51] Int. Cl.⁶ .................................. B23K 26/00
[52] U.S. Cl. ............... 219/121.63; 219/121.6; 219/121.77; 228/1.1
[58] Field of Search ............ 219/121.6, 121.63, 219/121.64, 121.85, 121.75, 121.77, 121.73; 228/1.1, 110.1; 156/73.1, 272.8

[56] References Cited

U.S. PATENT DOCUMENTS

| | | | |
|---|---|---|---|
| 4,534,811 | 8/1985 | Ainslie et al. | 219/121.63 |
| 4,547,652 | 10/1985 | Raisig et al. | 219/121.64 |
| 4,682,001 | 7/1987 | Locke | 219/121.63 |
| 4,785,156 | 11/1988 | Benko et al. | 219/121.64 |
| 4,792,658 | 12/1988 | Langhans et al. | 219/121.63 |
| 4,843,209 | 6/1989 | Milligan | 219/121.63 |
| 4,894,509 | 1/1990 | Chalco et al. | 219/121.6 |
| 4,926,022 | 5/1990 | Freedman | 219/121.63 |
| 4,945,489 | 7/1990 | Vahab | 219/121.63 |
| 4,963,714 | 10/1990 | Adamski et al. | 219/121.63 |
| 4,970,365 | 11/1990 | Chalco | 219/121.63 |
| 5,021,630 | 6/1991 | Benko et al. | 219/121.64 |
| 5,057,969 | 10/1991 | Ameen et al. | 361/386 |

FOREIGN PATENT DOCUMENTS

| | | | |
|---|---|---|---|
| 480275 | 4/1992 | European Pat. Off. | 219/121.6 |
| 60-162573 | 8/1985 | Japan | 219/121.85 |
| 60-184488 | 9/1985 | Japan . | |

OTHER PUBLICATIONS

"Novel Laser Soldering Process for Flex Circuit Attachment", IBM Tech. Bulletin, vol. 31, No. 3, Aug. 1988, pp. 206–207.

"Thermocouple Laser Sonic Bonder Tip", IBM Tech. Bulletin, vol. 33, No. 5, Oct. 1990.

Advertisement for Hobart Lasers & Advanced Systems "We're Flexible", *Industrial Laser Review*, Dec. 1993, p. 11.

*Primary Examiner*—Geoffrey S. Evans
*Attorney, Agent, or Firm*—Calfee Halter & Griswold

[57] ABSTRACT

A laser head for simultaneously attaching solder balls to a carrier has at least one solder tip, with the number of solder tips being equal to the number of solder balls to be attached to the carrier. Each solder tip is heated by an optical fiber in thermal contact with the tip at one end of the fiber and coupled to a laser, preferably operating in the infrared wavelength range, at the other end of the fiber via a multiplexer coupling device. A spring is used in association with each solder tip to bias each solder tip to hold the carrier in contact with the solder balls. The tip absorbs the radiant energy as it exits the optical fiber, and the tip is heated. The laser and multiplexer permit precise control over the heat imparted to the tip, which in turn permits control of the amount of the solder ball that is reflowed.

15 Claims, 2 Drawing Sheets

METHOD AND APPARATUS FOR SOLDERING WITH A MULTIPLE TIP AND ASSOCIATED OPTICAL FIBER HEATING DEVICE

BACKGROUND OF THE INVENTION

Conventionally, integrated circuit chips are connected directly to a substrate preferably a "carrier" which in turn is connected to the circuit board. Plated through-holes extend from one surface of the carrier through to the other surface and electrically connect the top side, that is the circuitized side, of the carrier to the bottomside of the carrier. Pads, which have a center hole therethrough are positioned over plated vias or through-holes. On the underside of the carrier, are solder balls; the solder balls are attached to carrier pads. Solder balls connect the chip carrier to the circuit board.

There are several techniques for attaching the solder balls to the bottom of the carrier. In one technique, the carrier is positioned atop the solder balls and the carrier and solder balls are either placed in a furnace, or hot air is blown along the underside of the carrier, to reflow a portion of the solder balls. However, with both of these techniques, the carrier is also heated. Upon cooling, the carrier often warps or cracks due to differential rates of heating and cooling of the materials used in the carrier.

Another method for attaching solder balls to the underside of a carrier, known as "microsurface welding", involves contacting a pad on the topside of the carrier with two probes, one positive the other negative. Current is induced through the pad which heats the pad. The heat is conducted from the pad to the metalized walls of the plated through hole, along the plated walls of the through-hole, through to the pad on the underside of the carrier and to the solder ball, where it reflows a portion of the solder. The molten solder is drawn through the center hole of the pad on the underside of the carrier, up through plated through-hole and ideally through the center of the pad of the top side of the carrier. Unfortunately, with this technique, When the probes contact the pad, they often tilt the carrier in relation to the ball which leads to poor contact and poor reflow of solder. Also tips oxidize and/or deteriorate, thus requiring high contact force; to maintain such high contact force the tips' positions must continually be adjusted. There is also variability in the height of the solder column that is drawn into the through hole. When the solder column is too high, the solder column can penetrate into adjacent layers of the carrier thereby causing a short, or cause the dielectric film to be pushed from the stiffener leading to warpage. Where the column of solder is too short, the bond between the solder ball and the carrier is weak. On the average, a shear pull strength of only 240 to 250 g is obtained using this technique, due to lack of uniformity in solder column height.

Moreover, if an insufficient amount of solder from a solder ball reflows, this leads to a defective electrical and/or mechanical connection between the solder ball and the carrier. Once the carrier is attached to the circuit board, it is not only difficult to detect a poor connection, it also is extremely difficult to access the underside of the carrier to repair a defective solder ball connection. Thus, a single defective connection between a solder ball and the carrier could render defective the entire structure into which the carrier has been incorporated. As a result of a single defective connection, the entire structure might have to be discarded.

It would be desirable to have a technique for connecting solder balls to carrier pads that does not require heating the entire carrier, improves yield of carriers, improves average bond strength of the solder balls, and provides suitable solder column height.

SUMMARY OF THE INVENTION

The present invention provides a novel technique and apparatus for attaching solder balls to substrates such as, for example, carriers, without heating the entire carrier. In the preferred embodiment, a multi-tip laser head is provided for simultaneously attaching a plurality of the solder balls to a carrier. The laser head comprises at least one solder tip, but preferably multiple solder tips; for a particular application, the minimum number of solder tips in the laser head depends upon the number of solder balls to be attached to the workpiece; preferably the multi-tip laser head contains at least as many solder tips as solder balls to be joined to the workpiece. The individual solder tips are heated by a heat source positioned inside the tip, preferably by an optical fiber. The optical fiber is coupled to a laser, preferably via a multiplexer coupling device. The radiant energy from the laser is conducted along the optical fiber. The tip absorbs the radiant energy as it exits the optical fiber, thus heating the tip. The laser and multiplexer coupling device permit precise control over the heat imparted to the tip, which in turn permits control of the amount of the solder ball that is reflowed. The laser and/or the multiplexer coupling device and/or an additional device connected to the laser and/or multiplexer coupling device, are preferably programmable.

Select tips are heated in a pattern that corresponds to the position of solder balls to be joined to the work piece; the pattern of heated tips is varied to correspond to different solder ball positions on different workpieces. Selective heating is accomplished preferably by programing of the multiplexer coupling device or by physically removing optical fibers from the tips that are not to be heated. Also tips are preferably removable so that tip patterns can be configured to correspond to the solder balls on the workpiece. Physical removal of tips is desired rather than selective heating, when, for example, a non-heated tip would physically interfere with a structure on a workpiece.

To connect the solder balls to a carrier using the laser head, a solder ball is positioned against a pad on the bottom of the carrier and a heated tip is positioned against the pad on the top side of the carrier. The heat is conducted from the pad to the walls of the plated through hole, along the plated walls of the through-hole, through to the pad on the underside of the carrier and to the solder ball, where it reflows a portion of the solder. The molten solder is drawn through the center hole of the pad on the underside of the carrier, up through the plated through-hole and ideally through the center of the pad of the top side of the carrier. The heat from the tip is conducted to the bottom pad to reflow a portion of the solder ball. The molten solder is drawn up through the through-hole, toward the heat source, to exit through the hole in the top pad.

DETAILED DESCRIPTION OF THE INVENTION

The present invention provides a novel method and apparatus, the multi-laser head, to attach solder balls to integrated circuit chip carriers. The multi-laser head, a preferred embodiment of the apparatus, simultaneously connects all the solder balls to the carrier.

The multi-laser head comprises at least one, and preferably multiple, solder tips, depending on the number of solder balls to be attached to the carrier. The solder tips comprise a longitudinal metal member having a longitudinal cavity disposed therein. Disposed within the cavity is a heating element, preferably an optical fiber positioned to terminate at the tip. The optical fiber is coupled to a laser, preferably via a multiplexer coupling device. The multiplexer coupling device permits rapid switching of the laser beam to the optical fibers disposed within the tips. For example, the multiplexer coupling device permits millisecond pulses of the laser light to be delivered to each tip. The radiant energy from the laser is conducted along the optical fiber. The tip absorbs the radiant energy as it exits the optical fiber, thus heating the tip.

The tip is positioned against the pad located on the top surface of the carrier, on the end of the metallized through hole, preferably a plated through hole, opposite a solder ball that is to be connected to the carrier. The laser is actuated, heating the tip. The heat from the tip is conducted through the pad, along the metallization of the through hole or the via to the pad on the underside of the carrier. The solder ball positioned against the pad on the underside of the carrier, is heated, and the solder ball reflows. Bonding is typically accomplished in about 50 milliseconds. Thus the solder ball is physically and electrically connected to the pad. Optionally the tip is indented to receive a small amount of solder. When the solder cools, the solder forms a cap or plug over the hole in the top pad.

Figure 1:
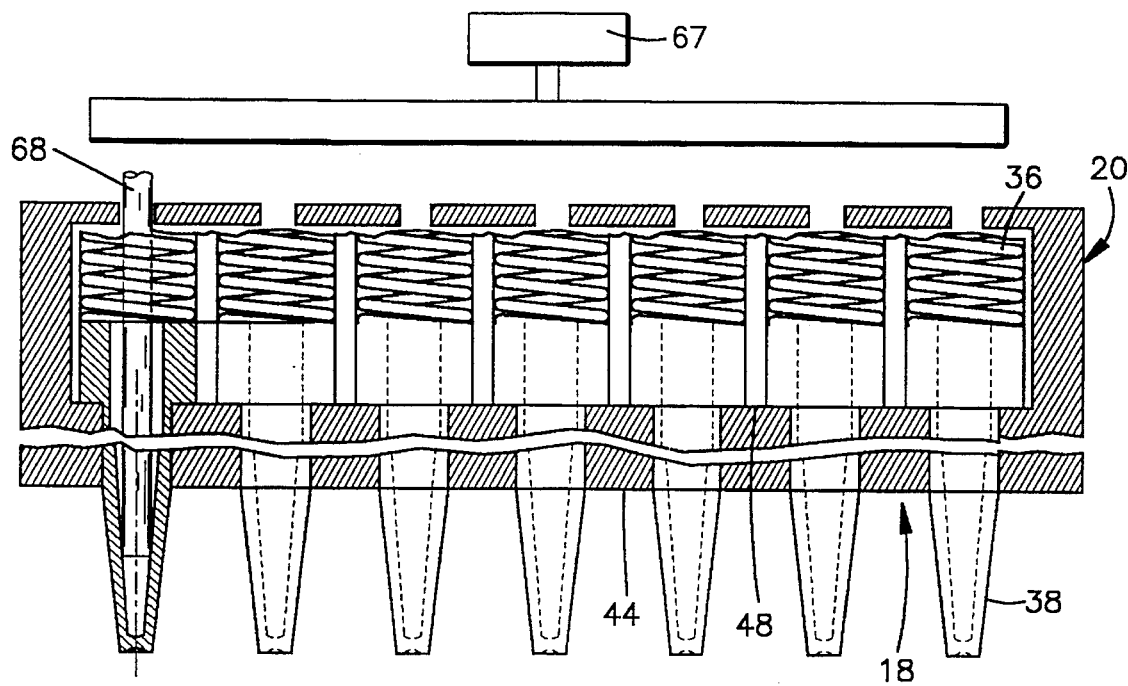
FIG. 1 is a sectional view of a portion of a multi-laser solder head according to this invention.
Figure 2:
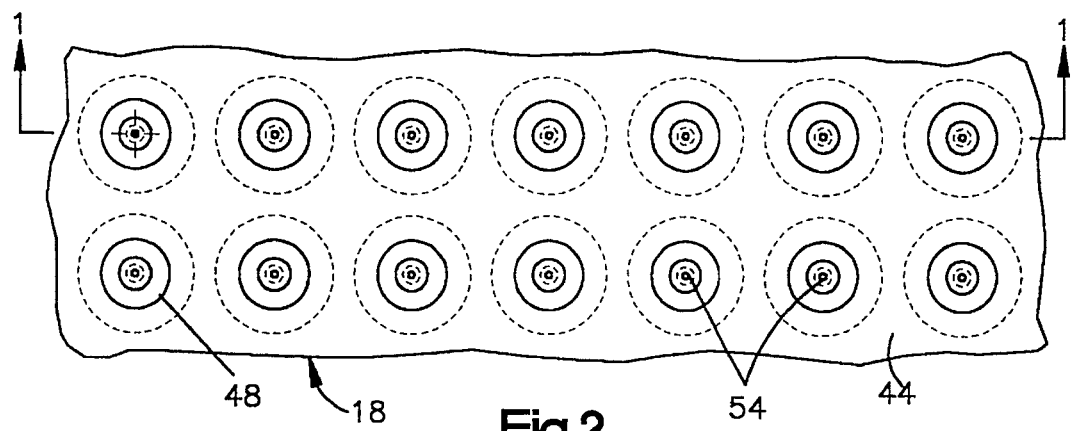
FIG. 2 is a bottom plan view of the laser head of FIG. 1.
Figure 3:
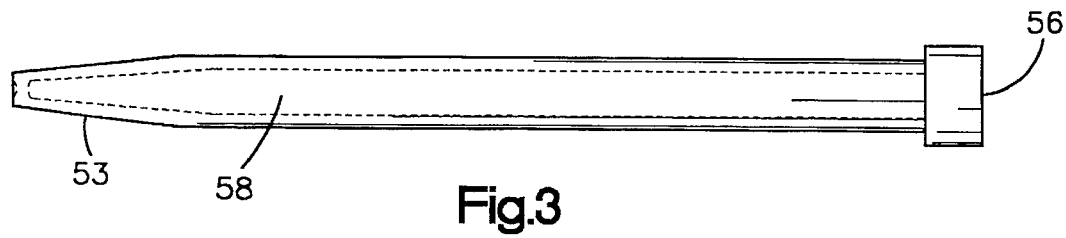
FIG. 3 is a sectional view of a tip of the laser head.
Figure 4:
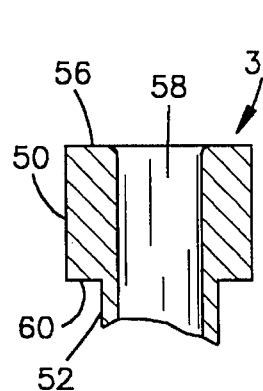
FIG. 4 is an enlarged view of the distal end of the tip shown in FIG. 3.

FIGS. 1-5 show the multi-laser soldering head to form the connections according to this invention. Referring now to FIGS. 1 and 2, a multi-laser solder head 10 is shown which is comprised of frame box 12 adapted to attach to conventional support, such as, for example, support arm 14 and lower surface 16 adapted to receive tip guide plate 18. Disposed within frame box 12 is spring guide plate 20, which provide support for tips 38. Spring guide plate 20, has a first end 22 and a second end 24 adapted for attachment to the inner walls of frame box 12. Spring guide plate 20 has multiple vertically extending cavities 26, which are preferably cylindrical, adapted to receive biasing members, preferably springs 28, which are preferably cylindrical coiled springs. The cavities 26 have a fixed end wall 30 which has a bore 32 therethrough. Springs 28 have a first end 34 and second end 36. First spring end 34 is positioned against end wall 30. Tip guide plate 18 is preferably removably attached to frame 12 so that the tip guide plate 18 can be removed to change or position tips 38, particularly to position tips 38 to correspond to the pads p on the surface the workpiece w. Tip guide plate 18 has holes 40 therethrough adapted to hold tips 38 in position. Tip guide plate 18 has upper surface 42 and lower surface 44. Upper surface 42 is positioned adjacent to spring guide plate surface 48 so that the holes 40 of tip guide plate align 18 with the cavities 26 in spring guide plate 20.

Referring now to FIGS. 3-6, tips 38 include distal end 50, shaft 52, and proximal end 53 which is adapted to contact work piece w. Tip shaft 52 is slidably disposed in holes 40 of tip guide plate 18 so that proximal ends project beyond holes 40. Distal end 50 rests in spring guide plate cavity 26. Distal end surface 56 is adapted to receive spring second end 36.

When tips 38 are biased against the pads BP of workpiece w, the tips 38 adjust in axial position to conform to the topology of the pads p. The shafts 52, of tips 38 slide in tip guide plate holes 40, and distal end 50 slides in cavity 26 of spring plate 20. Distal ends 50 slide along cavity 26 until distal end surface 56 contacts spring end 36. Distal end surface 56 is separated preferably about 0.470 inches from end 36 of spring 28. When tip 38 engages spring 28 exerts a downward force holding tip 38 to workpiece w, and holding workpiece w in contact with solder balls.

Each of the tips 38 have a cavity 58 formed therein. Cavity 58 extends from opening 26 in distal end 50 longitudinally into, but not through, tip 38. Toward distal end 50 the tip 38 flares to form a shoulder 60. Shoulder 60 engages surface 42 of tip guide plate 18. Optionally, the proximal tip end 54 has formed therein depression 62 for molding molten solder into solder cap S.

Referring again to FIG. 1, coupler 64 is connected to conventional laser 67, such as for example, a YAG laser or a diode laser. Preferably the laser 67 emits in the IR wavelength range. Attached to laser 67 is optical fiber 66 which conducts laser light from laser 67 to coupler 64. Coupler 64 divides laser light, such as for example by beam splitting or by time sharing such as done by a multiplexer coupler. The laser light is divided among multiple optical fibers 68. Multiple optical fibers 68 extend from coupler 64 through bores 32 in end walls 30, through the center of springs 28 into tip cavities 58 to terminate at, or near proximal ends 54 of cavities 58. Multiple optical fibers 68 conduct laser light from coupler 64, down to tip 38, where laser light is absorbed by tip 38, which heats tip 38.

Referring again to FIG. 6, to use the multi-laser head 10 of the present invention according to the method of the present invention, a workpiece w such as a chip carrier, is positioned atop of solder balls s which are held in place by a conventional basket B. The multi-laser head 10 is configured for selective heating of tips 38 so as to correspond to the position of the solder balls s. Such selective heating is accomplished by, for example: programming the coupler 64 to selectively direct laser light down optical fibers 68 so as to selectively heat tips 38; or by physically removing select optical fibers 68 from tips 38 so as to selectively heat tips 38; or by selectively removing tips 38 from the the multi-laser head 10.

The multi-laser head 10 is positioned over the work piece W using a conventional positioning apparatus such as, for example, x-y table and positioning mechanism, so that the tips 38 touch the desired top pads P on workpiece W. The tips are positioned against the pads with a force sufficient to keep the pads positioned against the pads during the soldering operation. Preferably the tip-to-through-hole force is at least 10 grams, preferably about 20 to 100 grams, more preferably about 30 to 75 grams. Individual tips 38 will be pushed upward by pads which lie higher than other pads; distal end 50 of tip 38 will push against end 36 of spring 28. Laser 67 is actuated, and light is conducted through optical fiber 66 to coupler 64. Coupler 64 divides, or apportions the laser light, among multiple optical fibers 68 which conduct laser light from coupler 64, to tips 38, to heat tips 38. The laser provides power sufficient to partially reflow the solder balls, preferably about 1 to 100 watts, more preferably about 10 watts. Each tip 38 is exposed a time sufficient to reflow solder balls, preferably from about 100 to 200 milliseconds, more preferably about 150 milliseconds, preferably of 10 watt laser light per tip 38, for a total energy of 1.5 Joules. The tip 38 is heated to preferably not greater than 400° C. The total energy provided to the solder balls depends upon the size of the solder balls, the type of solder, the length of the through-hole, and the laser. In the preferred embodiment, the heat is conducted through top pad TP, along the metal side walls M of the through holes H, through the bottom pad BP and into the solder ball s. The portions of the solder balls in contact with bottom pads reflow and are drawn through the bores in bottom pads, up through the plated through holes, out the bores of the top pads P where the solder contacts the proximal ends 54 of tips 38. The solder flows into indentations 62 in tips 38 when they are present where the solder cools and forms a cap SC. The multi-laser head is then raised from the workpiece W or the workpiece is lowered, the finished work piece removed and other workpieces provided and the process is repeated on the new workpiece.

Tips 38 are made of material which has a melting point above the solder melting point and what is not melted by the solder. The tip 38 absorbs the radiant energy being employed and is not wetted by the solder used in the solder balls. Suitable materials for tips 38 include, for example, tungsten, molybdenum, tungsten carbide, and titanium carbide. Suitable tungsten tips, although not sold as solder tips, include "wire bonding tips" commercially available from Technical Devices Inc. of Arizona, that have been modified. As purchased, the tips from Technical Devices have a hole extending from the proximal end into the tip to cavity 58. The hole is filled with tungsten by such techniques as for example, CVD, that is, chemical Vapor Deposition. Optional indentation 62 is created by conventional machining techniques.

Fibers 64 and 66 are conventional, commercially available optical fibers, preferably glass fibers. Suitable fibers are available from 3M. The optical fibers require a diameter that fit within cavity 58 of tip 38. Fibers having a diameter of preferably about 50 to 600 microns, more preferably 200 microns fit within the wire bonding tips from Technical Devices Inc. Preferably, such optical fibers are single fibers rather than bundled fibers.

Laser L is a conventional laser, such as, for example, preferably at least 10 watt, more preferably 100 watt continuous wave Nd: YAG laser available from Hobart or Quantronix, Long Island, N.Y., or Lee Laser, Orlando, Fla. Compact lasers require less power and are therefore preferred.

Coupling device 64 is preferably a multi-plexing coupling device which directs the entire laser beam down each optical fiber 68 for discrete units of time. Such coupling devices are commercially available from for example Cambridge Technology Inc. under the designation "Cambridge Optical Scanner #6800," which scans individual fibers in 300 microseconds. Other suitable coupling devices 64 include traditional beam splitting devices such as available from Newport. Since many commercial devices permit coupling of a laser beam to only a limited number of fibers, custom devices may be designed, depending on the number of tips 38 to be included in the embodiment of the multi-laser head.

Evaluation of the Heating Method to Connect Balls to Carriers

Figure 7:
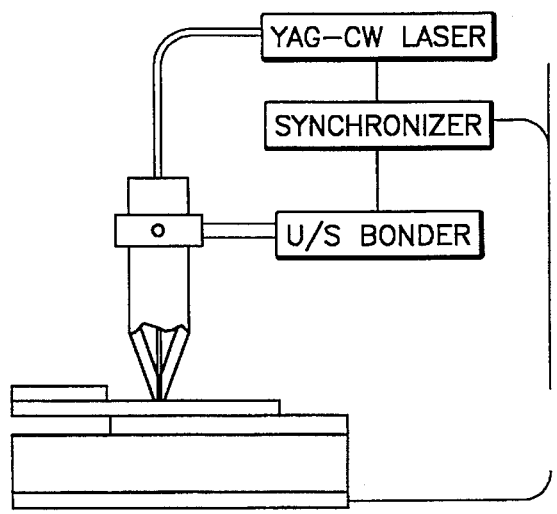
FIG. 7 is a schematic representation of the single tip device used to evaluate the method of attaching solder balls to carriers of the present invention.
Figure 6:
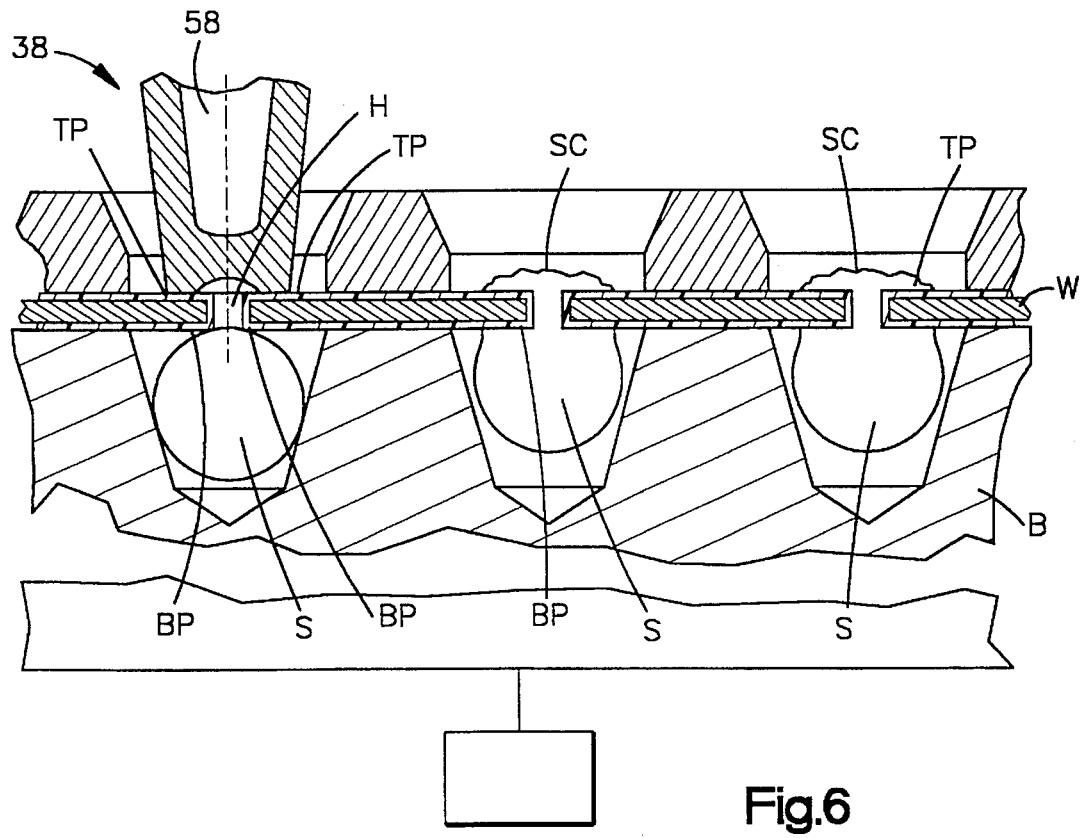
FIG. 6 is a sectional view of a portion of a work piece showing solder balls attached to a carrier, and illustrates the placement of one tip of the laser during attachment of solder balls to the carrier.

Solder balls of 0.025 in. diameter made of 90/10 solder, that is 90% lead, 10% tin, which has a melting point of about 268° to 300° C. were positioned in a conventional holder, positioned against the pad on the underside of a polyimide carrier. A device not within the scope of the invention, which contained single tungsten wire bonding tip from Technical Devices, Inc. having an optical fiber disposed therein was connected to a 100 watt NdiYAG laser from Quantronix, as shown in FIG. 7. The tip was positioned against the pad on top of the carrier; the pad was located over a plated through hole in the carrier. The laser emitted a wavelength of 1.060 nm, and provided 8–10 watts at an exposure time of about 100–200 milliseconds. The heat was conducted from the pad on the top of the carrier to the walls of the plated through hole, along the plated walls of the through-hole, through to the pad on the underside of the carrier and to the solder ball, where it reflowed a portion of the solder. The molten solder was drawn through the center hole of the pad on the underside of the carrier, up through plated through-hole and ideally through the center of the pad of the top side of the carrier. This process was repeated to reflow several hundred solder balls individually. The solder balls positioned against the pad on the underside reflowed, to provide a strong physical connection and electrical connection to the carrier.

Attempts were made to peel solder balls from carriers, but were unsuccessful. Instead the polyamide carriers began to break apart rather than the connections failing. The average bond strength was about 300 grams as measured by shear pull strength test, using a Dage series 22 microtester.

The carrier connectors were also evaluated electrically. Of the hundreds of solder balls connected to the carriers, none of them failed electrical tests.

Figure 5:
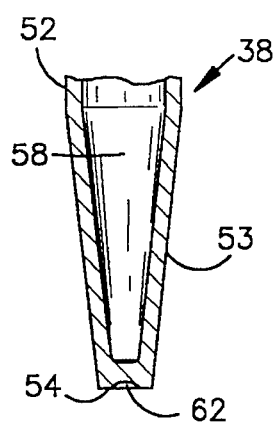
FIG. 5 is an enlarged view of the proximal end of the tip of FIG. 3.

To connect a solder ball to a carrier, preferably to simultaneously connect two or more solder balls, using the multi laser head, an embodiment of which is shown in FIGS. 1 and 5, is employed. Tips 38 are placed in holes 40 of spring guide plate 18 to correspond to the position of the through holes to which solder balls will be connected, as determined by circuitization design. Solder balls are held against pads on the underside of the carrier and the multi laser head is positioned over the carrier using conventional apparatus such as an x-y table. The laser head is lowered so the tip contacts the corresponding pads on the top of the carrier. Then laser 67 and coupler 64 are turned on. The tips 38 are heated which heat the pads on top of the carrier, heat is conducted to bottom pads and portion of solder on solder balls reflows. The laser head is raised and another carrier with solder balls is placed below the laser head.

Although certain embodiments of this invention have been shown and described, various adaptations and modifications can be made without departing from the scope of the invention as defined in the appended claims.

What is claimed is:

1. A heating device for connecting solder balls to pads on a substrate wherein said substrate includes at least one metalized through hole, and wherein a first pad is disposed at one end of each metalized through hole and a second pad is disposed at the other end of each metallized through hole, said heating device comprising:

at least one tip, each tip having a cavity therein;

an optical fiber associated with each tip, each fiber having a first end and a second end, the first end being disposed in said cavity and in thermal contact with said tip;

a support member;

a biasing member, associated with each tip, each tip and biasing member being mounted in the support member to permit each tip to move axially in said support member.

2. The heating device of claim 1, further comprising:

a laser, and a coupling device optically connected to the laser and to the second end of each optical fiber.

3. The heating device of claim 2, further comprising:

a plurality of tips;

a mounting member disposed to mount the substrates with a solder ball in contact with the first pad of each metallized through hole and with the second pad of each metallized through hole oriented toward said support member;

a drive assembly interconnecting said mounting member and said support member to selectively move said mounting member and support member toward and away from each other to thereby bring said each of said tips into engagement with one of said second pads; and a control mechanism to actuate said laser when each of said tips is in contact with one of said second pads.

4. The heating device of claim 1 wherein there are a plurality of tips.

5. The heating device of claim 4, further comprising a multiplexer coupling device to apportion laser light among one or more of the optical fibers.

6. The heating device of claim 1, further comprising: a depression in the end of each tip.

7. A method for connecting solder balls to pads on substrate comprising the steps of:

a. providing a substrate having a first pad disposed at one end of a metallized through-hole and a second pad disposed at the other end of the hole;

b. providing a heating device comprised of:
at least one tip having a cavity therein;
a laser,
a coupling device, optically connected to the laser;
an optical fiber associated with each tip, each fiber having a first end and a second end, the first end being disposed in the cavity and in thermal contact with said tip, and the second end connected to said coupling device; and
a biasing member associated with each tip, each tip and biasing member being mounted in a support to permit each tip to move axially in said support;

c. positioning a solder ball against each second pad;

d. placing each tip in contact with a first pad, biased by said biasing member; and e. actuating the laser to heat each of said tips through said associated fiber so as to heat each second pad for a time and temperature sufficient to partially fellow the solder of each ball.

8. The method of claim 7 wherein each tip is biased against each pad with a force of about at least 10 grams.

9. The method of claim 7 wherein the heating device comprises a plurality of tips which may be selectively heated.

10. The method of claim 7 wherein each metallized through-hole is a plated through-hole.

11. The method of claim 7 wherein the laser provides from about 1 to 100 watts to each tip.

12. The method of claim 7 wherein each tip is exposed, to about 100 to 200 milliseconds of about 10 watt laser light per tip.

13. The method of claim 7 wherein each tip is exposed to from about 0.2 to about 2 Joules for each reflow of solder.

14. The method of claim 7 wherein each tip is heated to not greater than 400° C.

15. A method for connecting solder balls to pads on substrate comprising the steps of:

a. providing a substrate having a first pad disposed at one end of a metallized through-hole and a second pad disposed at the other end of the hole;

b. providing a heating device comprised of:
at least one tip having a cavity therein;
a laser,
a coupling device, optically connected to the laser;
an optical fiber associated with each tip, each fiber having a first end and a second end, the first end being disposed in the cavity and in thermal contact with said tip, and the second end connected to said coupling device; and
a biasing member associated with each tip, each tip and biasing member being mounted in a support to permit each tip to move axially in said support;

c. positioning a solder ball against each second pad;

d. placing each tip in contact with a first pad, biased by said biasing member; and e. actuating the laser to heat each of said tips through said associated fiber so as to heat each second pad for a time and temperature sufficient to partially reflow the solder of each ball.

* * * * *

UNITED STATES PATENT AND TRADEMARK OFFICE
CERTIFICATE OF CORRECTION

PATENT NO. : 5,565,119
DATED : Oct. 15, 1996
INVENTOR(S) : Behun et al

It is certified that error appears in the above-indentified patent and that said Letters Patent is hereby corrected as shown below:

In the claims, column 8, line 6, it should read -and temperature sufficient to partially reflow the solder- NOT." and temperature sufficient to partially fellow the solder"

Signed and Sealed this

Seventh Day of January, 1997

Attest:

BRUCE LEHMAN

*Attesting Officer*              *Commissioner of Patents and Trademarks*